United States Patent [19]
Kominsky

[11] Patent Number: 5,153,510
[45] Date of Patent: Oct. 6, 1992

[54] HIGH IMPEDANCE SYSTEM FOR MEASURING VOLTAGE

[75] Inventor: Richard A. Kominsky, Westfield, Mass.

[73] Assignee: K and M Electronics, Inc., West Springfield, Mass.

[21] Appl. No.: 676,855

[22] Filed: Mar. 28, 1991

[51] Int. Cl.⁵ .................. G01R 33/00; G01R 19/00
[52] U.S. Cl. ..................... 324/99 D; 324/76 R; 324/99 R; 324/130; 364/483
[58] Field of Search ............ 324/99 D, 99 R, 115, 324/116, 120, 96, 76 R, 132, 142, 74, 130; 364/483, 481; 358/107; 340/870.01, 870.02

[56] References Cited

U.S. PATENT DOCUMENTS

| | | | |
|---|---|---|---|
| 2,880,392 | 3/1959 | Paulsen | 324/99 D |
| 3,196,418 | 7/1965 | Schneberger et al. | 324/99 D |
| 4,015,191 | 3/1977 | Okumura | 323/16 |
| 4,017,810 | 4/1977 | Vahaviolos | 324/120 |
| 4,213,088 | 7/1980 | Nossen | 324/98 |
| 4,282,576 | 8/1981 | Elms et al. | 364/483 |
| 4,901,078 | 2/1990 | Goyal | 324/99 D |
| 5,013,154 | 5/1991 | Kominsky | 358/107 |

FOREIGN PATENT DOCUMENTS

| | | |
|---|---|---|
| 3246944 | 6/1984 | Fed. Rep. of Germany . |
| 263166 | 12/1988 | Fed. Rep. of Germany . |
| 447622 | 5/1975 | U.S.S.R. . |
| 455298 | 6/1975 | U.S.S.R. . |
| 761998 | 9/1980 | U.S.S.R. . |
| 1045142 | 9/1983 | U.S.S.R. . |

OTHER PUBLICATIONS

Page 359 of Official Gazette of Jul. 6, 1982.
Radio Electronics, pp. 52-59, Nov. 1981.

Primary Examiner—Vinh Nguyen
Attorney, Agent, or Firm—Lahive & Cockfield

[57] ABSTRACT

A high voltage measuring system with very high input impedance. The system measures a high voltage source under test by developing a control signal which is proportional to the differential voltage between the high voltage source being tested and an adjustable high voltage reference. This control signal is fed back into a controller which adjusts the reference source so as to match the reference source with the source under test. When the controller detects that matching has occurred, it measures the reference source. By measuring the reference source, as opposed to measuring the source under test directly, the system avoids loading down the source under test.

8 Claims, 3 Drawing Sheets

HIGH IMPEDANCE SYSTEM FOR MEASURING VOLTAGE

BACKGROUND OF THE INVENTION

The present invention relates to voltage measuring systems and specifically to a high voltage measuring system having a high input impedance for use in measuring high voltage, low amplitude signals from high impedance sources.

Certain high voltage, low current power supplies generally have very high output impedances. Such power supplies might be used to drive an image converter or an intensifier tube, for example. Performing voltage measurements on such power supply outputs is difficult because of their high output impedances, principally because it is difficult not to load down such power supplies with conventional measuring equipment, which then introduces error into the measured readout. For example, to obtain less than 0.1% measurement error, the measuring device must have an input resistance that is at least 100 times greater than the output resistance of the high voltage power supply being tested. If the power supply already has high impedance, such as in the megohm or gigohm range, then the measurement equipment must have an input impedance in the terohm range. By way of example, a model ESH-1X electrostatic volt meter, manufactured by Sensitive Research, Inc., may be used to measure 7500 volt, 10 gigohm voltage sources.

There are many industrial measurement applications, however, which require remote monitoring capabilities for high voltage supplies, i.e., for sensing parameter signals at one location and transferring information representative of the sensed parameter signals to another location. By way of example, such remote monitoring capability may be important when the supply is in a hazardous environment. One approach suitable for performing such remote monitoring is disclosed in U.S. patent application No. 422,133, now U.S. Pat. No. 5,013,154 (KML-118), assigned to the assignee of the present invention. In accordance with that approach, a conventional electrometer may be connected to the source to be monitored in the hazardous environment. A remotely located video generates data representative of an image of the electrometer needle and scale, and that data is analyzed to identify the position of the needle relative to the scale. While this approach is effective to provide remote measurements of a high voltage, high impedance supply, there is a relatively high cost associated with such measurements due to the requirement for a video camera. Moreover, the image data is converted to output voltage data based on a conversion of the image data texts compared to a look-up table, rather than directly measured information.

It is an object of the present invention to provide a high input impedance voltage measuring system for remotely reading sensed voltages.

Another object is to provide an improved system for measuring voltages at a high impedance source.

SUMMARY OF THE INVENTION

The present invention provides a system with extremely high input impedance for remotely measuring high voltage, low current sources. In view of this low-loading feature, the system facilitates remote monitoring without loading the source to be measured. In one embodiment of the invention, when measuring a 6000 vdc power supply, the circuit effectively presents a load resistance to the power supply of more than 300 terohms and draws approximately 20 picoamperes.

In one aspect of the invention the voltage measuring system of the present invention includes a high impedance, floating potential referenced input buffering network, a window comparator/isolator network, an adjustable high voltage reference network and an associated reference voltage measurement network, and a control (computer) network. Generally, with this configuration, the high voltage network provides a ground referenced high voltage $V_{ref}$ which is directly connected to the floating potential of the system. The magnitude of $V_{ref}$ (with respect to ground) is adjustably controlled by control network (which monitors $V_{ref}$).

Typically, the voltage-to-be-measured is applied to a pair of input terminals. One of those terminals is coupled to a first reference potential (such as Earth-ground). The input buffering network performs buffering action to the potential at the other of the terminals, providing a very small load to the voltage source generating the potential. A buffered potential $V_a$, representative of the input potential is produced by the input buffering network. The comparator/isolator network compares the buffered potential $V_a$ against a reference potential $V_{ref}$. The comparator/isolator network provides an electrically isolated, Earth-ground referenced signal $V_1$, $V_2$ to the control network. The signal is indicative of whether the potential $V_a$ is equal to $V_{ref}$ to within a predetermined amount (window), less than $V_{ref}$ by greater than the amount allowed by the window, or greater than $V_{ref}$ by greater than the amount allowed by the window.

When the signal $V_1$, $V_2$ indicates that $V_a$ is out of the predetermined window, the control network generates a feedback signal $V_{fb}$ that adjusts the high voltage reference network so that $V_{ref}$ changes until $V_a$ is within the desired range. When $V_a$ is within that range, then control network determines that $V_{ref}$ substantially equals $V_{in}$ (within the tolerance allowed by the window) and an output signal $V_{out}$ representative of the magnitude of $V_{ref}$ is generated on an output line.

BRIEF DESCRIPTION OF THE DRAWINGS

These and other features and advantages of the present invention will be more fully understood by reference to the following detailed description in conjunction with the attached drawing in which like reference numerals refer to like elements and in which.

DETAILED DESCRIPTION OF PREFERRED EMBODIMENTS

Figure 1:
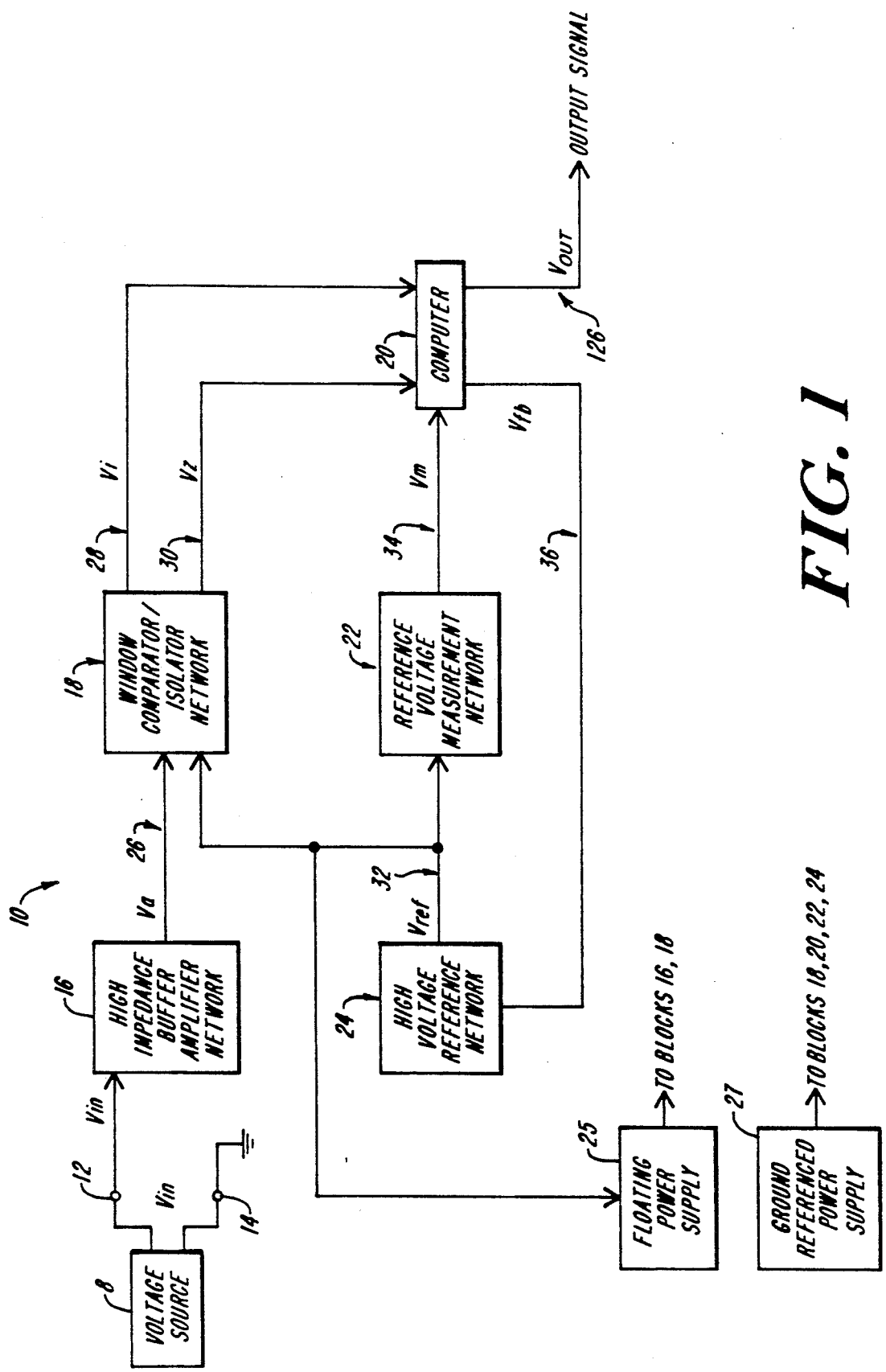
FIG. 1 is a block diagram of a high impedance voltage measuring system according to the invention.

As seen in the block diagram of FIG. 1, the potential difference ($V_{in}$) across high voltage terminals 12 and 14 of a voltage source 8 is measured by measuring system 10 according to a preferred embodiment of the invention. In the preferred embodiment, terminal 14 is connected to Earth-ground, although other reference potentials might alternatively be used.

The system 10 includes a floating referenced high input impedance buffer amplifier network 16. The buffer amplifier network 16 is powered from a floating reference potential power supply 25. Network 16 produces a buffered signal $V_a$ representative of the source voltage under test $V_{in}$, while providing minimal loading to power supply 8.

Amplifier output $V_a$ is applied via line 26 to a window comparator isolator network 18. In the preferred embodiment, comparator/isolator network 18 includes a floating referenced input stage which is optically coupled (and electrically isolated from) an Earth-ground referenced output stage. Network 18 is a three state comparator which generates an Earth-ground referenced signal $V_1$, $V_2$ on lines 28, 30 indicative of whether the reference voltage $V_{ref}$ is within a predetermined range, higher than that range, or lower than that range measured with respect to the source voltage $V_{in}$ under test. The comparator/isolator network 18 transfers to signal $V_1$, $V_2$ via lines 28 and 30 to a control network (computer 20).

Computer 20 generates a feedback voltage $V_{fb}$ on line 36 which drives a high voltage reference circuit 24, the source of $V_{ref}$, or generates an output signal $V_{out}$ on line 126, according to the state of data signal $V_1$, $V_2$. The output $V_{ref}$ of reference circuit 24 on line 32 is applied to reference voltage measuring circuit 22. Circuit 22 in turn generates an analog output signal $V_m$ proportional to the voltage level of reference voltage $V_{ref}$ but which is scaled to a safe level for delivery to computer 20 via line 34.

More specifically, The computer processes the inputs on lines 28 and 30. If $V_1$ goes low (and $V_2$ remains high), then $V_{ref}$ is too low; if $V_2$ goes low (and $V_1$ remains high), then $V_{ref}$ is too high. In either case, the level of $V_{fb}$ is adjusted responsively. If $V_1$ and $V_2$ are both high, then $V_{ref}$ is within the desired tolerance window and is acceptable; the computer 20 then reads $V_m$ and generates $V_{out}$. ($V_1$ and $V_2$ are never low simultaneously.)

The spread between the level of $V_{in}$ at which $V_1$ and $V_2$ each goes low sets an "error window" within which value $V_{ref}$ is considered to be equal to $V_{in}$. Thus when both $V_1$ and $V_2$ are high, i.e. when $V_{in}$ is within the "error window" and comparator circuit 18 is at equilibrium, the computer responsively performs an analog-to-digital conversion of analog signal $V_m$ (which represents $V_{ref}$ which in turn is now equivalent to $V_{in}$) and issues output $V_{out}$ representative of $V_{in}$.

Figure 2:
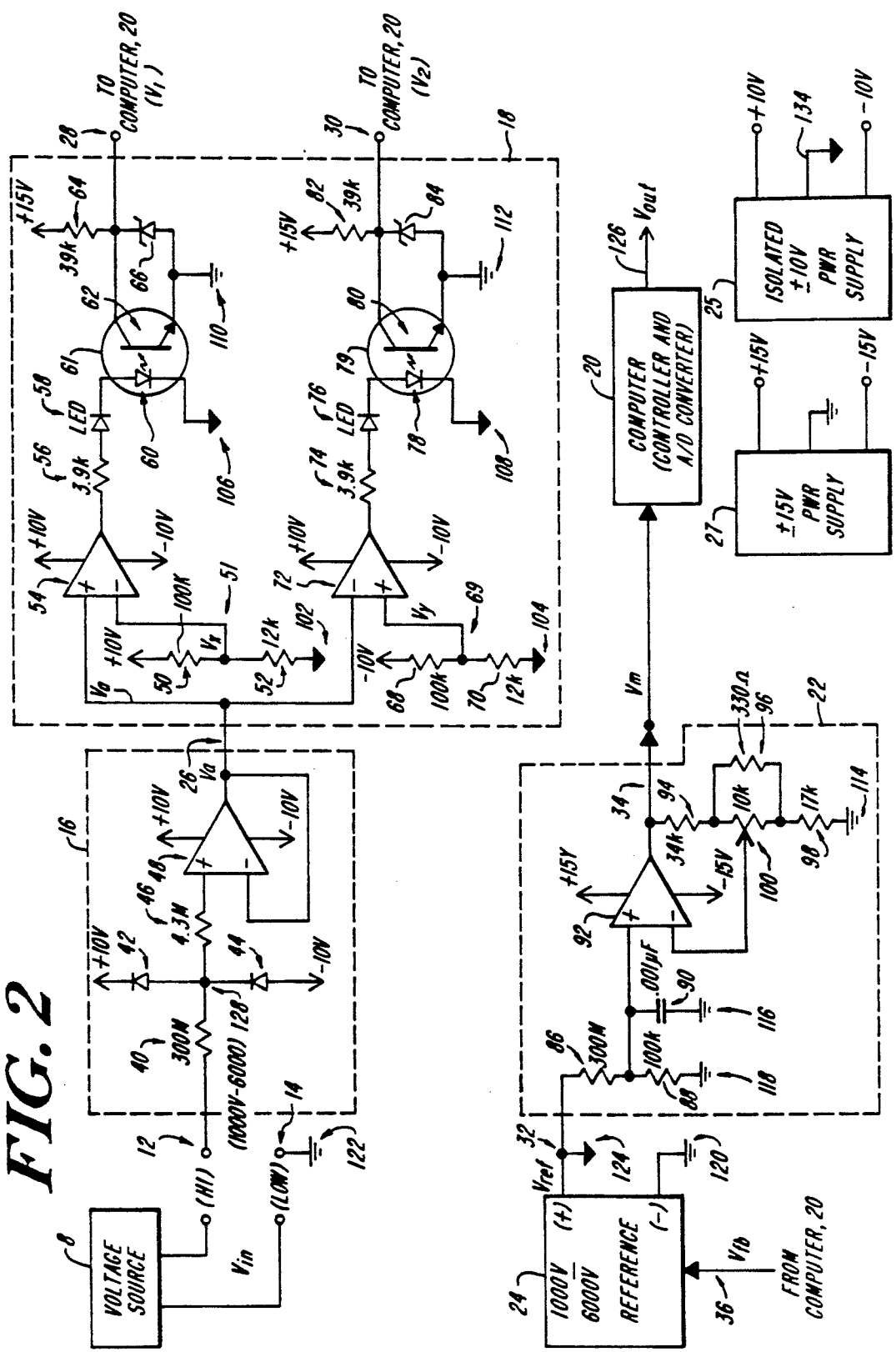
FIG. 2 is a schematic diagram of an embodiment of the system of FIG. 1.

An embodiment of the system 10 is shown in detailed schematic form in FIG. 2. As shown there, system 10 includes an isolated +/−10 vdc (relative to a floating reference potential) source provided by a switching power supply 25. The high voltage reference source 24 preferably operates between about 1000 vdc and 6000 vdc, with its low side connected to Earth-ground. The floating ground reference 134 of the +/−10 vdc supply 25 is coupled to the high side of supply 24, ie., to $V_{ref}$, by way of terminal 134 at supply 25 and terminal 124 on line 32 at supply 24. As a result, the +/−10 vdc isolated source is tied to $V_{ref}$, for purposes set forth below. Also provided is a conventional +/−15 vdc (relative to Earth-ground) supply 27.

In operation, the high voltage source 21 under test supplies $V_{in}$ to the high voltage input 12 of system 10, which is fed through serially connected current limiting resistors 40, 46 to the non-inverting input of high impedance unity gain non-inverting amplifier 48. The amplifier is biased by $V_{ref}$ via the floating +/−10 vdc power supply 25. The amplifier's input is clamped between the floating +/−10 vdc supply by diodes 42, 44, coupled to node 128, to avoid overload of the amplifier.

The output $V_a$ from amplifier 48 is coupled back to its inverting input and also by line 26 to window comparator circuit 18. Since the amplifier 48 is configured as a buffer, the output $V_a$ is representative of the input voltage $V_{in}$.

The voltage output $V_a$ of amplifier 48 drives the two comparators 54, 72 of window comparator circuit 18. The comparators are coupled in a manner that detects whether $V_{in}$ is within the "error window" centered about $V_{ref}$. A respective biasing network 51, 69 offsets each respective amplifier 54, 72 to create a respective upper and lower bound of the "error window". When the "error window" is exceeded, one of the two comparators 54, 72 goes low which ultimately informs computer 20 that $V_{ref}$ is either too high or too low.

Voltage divider network 51 applies a bias voltage $V_x$ to the inverting input of comparator 54 via a pair of resistors 50, 52 tied between +10 vdc and at floating ground 102 ($V_{ref}$). Because comparator 54 is biased several volts $V_x$ above $V_{ref}$, this comparator detects the condition of $V_{in}$ being too high above $V_{ref}$, but only when $V_a$ is greater than $V_x$. Comparator 54 therefore is biased to issue a "$V_{ref}$ too low" signal, when appropriate.

Voltage divider network 69 applies a bias voltage $V_y$ to the non-inverting input of comparator 72 via a pair of resistors 68, 70 tied between the −10 isolated supply and $V_{ref}$ at floating ground 104. Because comparator 72 is biased several volts $V_y$ below $V_{ref}$, this comparator issues a "$V_{ref}$ too high" output when it detects the condition of $V_{ref}$ being too high compared to $V_{in}$ when $V_a$ is less than the applied bias voltage $V_y$. This biasing arrangement establishes the aforesaid "error window", bounded by ($V_{ref}+V_x$) and ($V_{ref}-V_y$), within which range $V_{ref}$ is considered to be equivalent to $V_{in}$.

The outputs of comparators 54, 72 are tied via current limiting resistors 56, 74 and LEDs 58, 76 respectively to the anode of an LED 60 of optocoupler 61 and the anode of an LED 78 of optocoupler 79. LEDs 58, 76 are visual aids which indicate system performance. The cathodes of LEDs 60, 78 are tied to floating ground (at $V_{ref}$) at terminals 106, 108. Optocouplers 60, 78 provide high impedance isolation between the system input and computer 20. The detector transistors 62, 80 of optocouplers 60, 78, provide the digital control signal (comprising $V_1$ and $V_2$) to computer 20 indicative of the relationship of $V_{in}$ and $V_{ref}$.

Reference voltage measurement circuit 22 receives $V_{ref}$ on line 32 which is applied via voltage divider 86, 88 to the non-inverting input of amplifier 92. Capacitor 90 filters transients in the divided reference voltage signal and operational amplifier 92 amplifies the reference voltage signal to produce measurement voltage signal $V_m$ on line 34. Resistors 94, 96, 98 and variable resistor 100 are a voltage divider network tying the operational amplifier output to Earth-ground 114. A tap on resistor 100 is coupled to the inverting input of operational amplifier 92 for the purpose of setting the gain of the circuit. Computer 20 receives $V_m$ on line 34 and applies that signal to an analog-to-digital converter to produce the output signal $V_{out}$ when $V_{in}$ is within the "error window".

More particularly, the collector and emitter of each detector transistor 62, 80, of optocoupler 61 or 79, is tied between 15 volts (via a pull-up resistor 64, 82,) and Earth-ground 110, 112. With a transistor 62, 80, thus biased, if a "$V_{ref}$ too low" signal from comparator 54 or a "$V_{ref}$ too high" signal from comparator 72 forward biases a respective LED 60, 78, transistor 62 or 80 turns on indicative of that state, driving computer 20 accordingly. Since both of the transistor 62, 80 collector outputs are nominally high (i.e., tied to +15 vdc) when comparators 54, 72 are off, the computer decodes the state of both $V_1$ and $V_2$ being high as indicating that $V_{ref}$ is within tolerance of $V_{in}$, and that $V_{ref}$ can be measured, as $V_m$, as an indirect, low-load way of measuring $V_{in}$. Zener diodes 66, 84 clamp the voltage on lines 28, 30 to approximately 5 volts to conform to standard TTL voltage level standards.

Conversely, the output $V_1$ or $V_2$ of respective transistor 62 or 80, on lines 28, 30, goes low when a respective LED 60, 78 is forward biased and turns on transistor 62 or 80 (since the emitters are tied to ground at 110, 112). In view of the foregoing, if the data signal $V_1$ on line 28 goes low, computer 20 adjusts $V_{fb}$ to raise $V_{ref}$, while if the data signal $V_2$ on line 30 goes low, then $V_{fb}$ is adjusted to reduce $V_{ref}$ accordingly. This adjustment of $V_{ref}$ toward $V_{in}$ according to $V_{fb}$ is an iterative process which proceeds until $V_{ref}$ is within the "error window" set by bias circuits 51, 69, at which time $V_1$ and $V_2$ both go high.

As a result of the foregoing, when measuring a 6000 vdc supply, a circuit in practice of the invention may effectively present a load to the power supply under test of $300 \times 10^{15}$ ohms (6KV/20pA), while permitting comparative measurement using a conventional reference power supply 24 having a much lower impedance than the unknown voltage supply under test. There is minimal loading error when supply under test is measured, such that $V_m$ accurately represents the value of $V_{ref}$.

Figure 3:
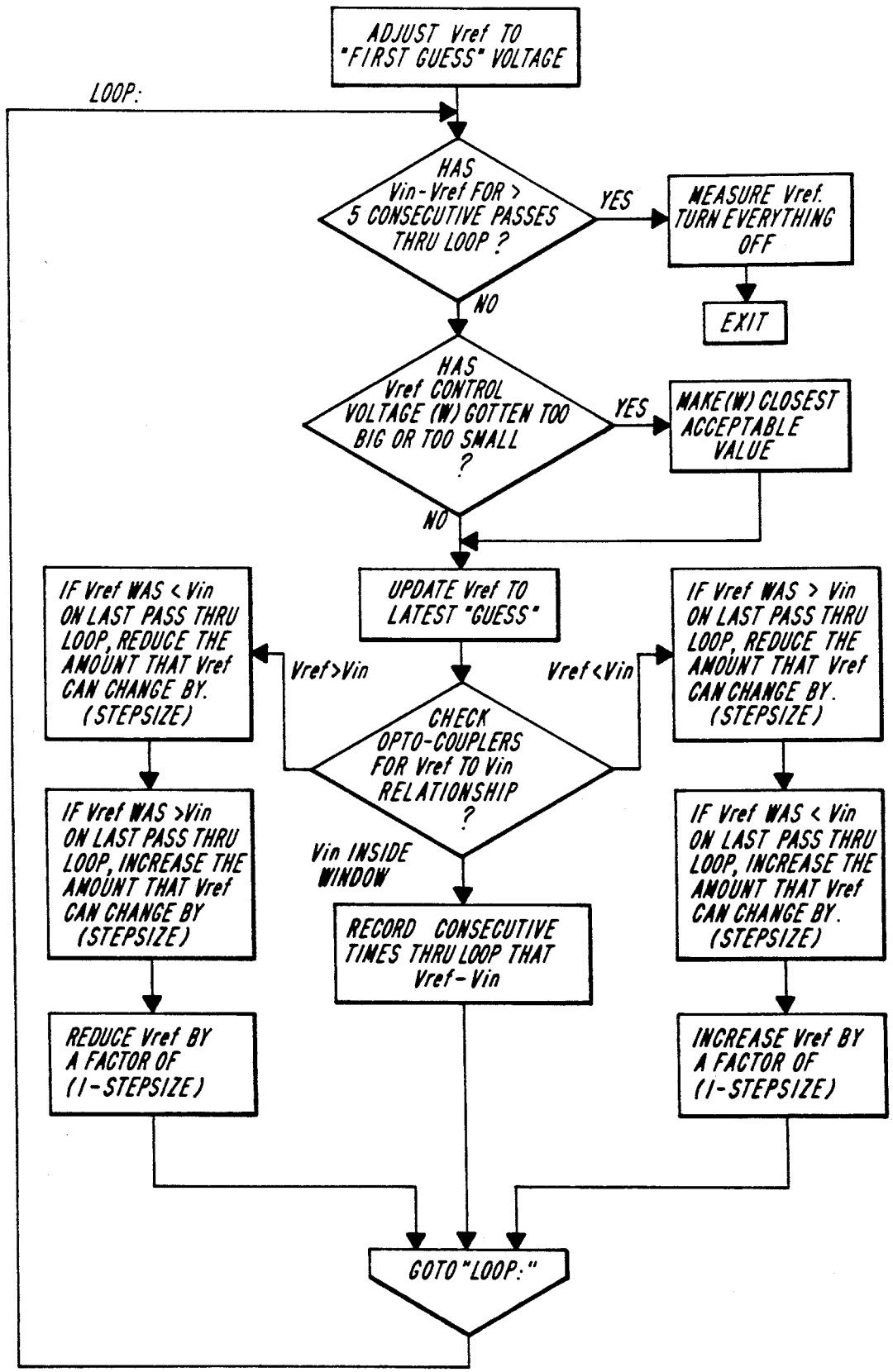
FIG. 3 is a flow chart illustrating the operation of the controller of the system of FIG. 1.

Computer 20 is programmed as set forth in Appendix A, having an operation as depicted in the flow chart of FIG. 3. In the preferred embodiment, computer 20 is an International Business Machine (IBM) AT compatible computer, amplifiers 48, 54, 72 and 92 are type LF156 high impedance JFET operational amplifiers, available from National Semiconductor. Optoisolators 61, 79 are conventional discrete infrared light emitting diodes and infrared sensitive phototransistors. The $V_{ref}$ power supply 24 is a M/2195X type, available from K and M Electronics Inc., West Springfield, MA.

While specific embodiments of the invention have been set forth above, other embodiments are also within the spirit and scope of the present invention. For example, the present embodiment has a voltage range of 1000–6000 vdc, however other ranges are equally within the scope of the invention. Therefore, the foregoing description will be understood by way of illustration and not limitation. Therefore the scope of the invention is as set forth in the claims appended hereto.

What is claimed is:

1. A high impedance system for performing a high voltage measurement of a ground referenced input voltage $V_{in}$, said system comprising
   A. a reference source for producing a ground referenced high voltage reference signal $V_{ref}$, said reference source being variable and adjustable over a predetermined range, including $V_{in}$,
   B. input means for receiving said ground referenced input voltage $V_{in}$, said input means having a relatively high input impedance, and including means for generating a signal $V_a$ referenced to $V_{ref}$ and representative of $V_{in}$,
   C. window comparator means in communication with said input means for receiving $V_a$ and producing a data signal having a first value in response to the condition of $V_{in}$ being at least about $V_x$ volts greater than $V_{ref}$ and for producing said data signal having a second value in response to the condition of $V_{in}$ being at least about $V_y$ volts less than $V_{ref}$, said data signal having a third value $V_3$ when $V_{in}$ satisfies the condition of $(V_{ref}+V_x) > V_{in} > (-V_{ref}-V_y)$, when $V_x$ and $V_y$ are positive and either or both are nonzero values, or the condition $V_{in} = -V_{ref}$ when $V_y$ and $V_x$ are zero,
   D. adjustment means in communication with said reference source and said window comparator means for causing said reference source to increase $V_{ref}$ in response to said data signal having said first value and to decrease $V_{ref}$ in response to said data signal having said second value,
   E. measuring means in communication with said reference source for measuring the value of $V_{ref}$ and generating a measurement signal $V_m$ representative of $V_{ref}$, and
   F. output means in communication with said measuring means and said window comparator means for producing an output signal in response to $V_m$ which is representative of $V_{in}$ when said data signal is at said third value.

2. The system of claim 1 further comprising an isolated coupling means for electrically isolating said window comparator means from said adjustment means.

3. The system of claim 2 wherein said isolated coupling means comprises optical couplers.

4. The system of claim 1 wherein said input means, includes an operational amplifier having a noninverting terminal, an inverting terminal, and an output terminal, said noninverting terminal being coupled to receive $V_{in}$ and said inverting terminal being coupled to said output terminal, and further comprising an over-voltage protection means for protecting said input operational amplifier from destructively high applied voltage at said noninverting terminal.

5. The system of claim 4, wherein said input operational amplifier is powered by a voltage referenced to $V_{ref}$.

6. The system of claim 1 wherein said window comparator means comprises a first operational amplifier including means for generating a first signal ($V_1$) representative of whether $V_{in}$ is greater than $(V_{ref}+V_x)$, and a second operational amplifier including means for generating a second signal ($V_2$) representative of whether $V_{in}$ is less than $(V_{ref}-V_y)$, wherein said first and second operational amplifiers are powered by a voltage referenced to $V_{ref}$.

7. The system of claim 1 wherein said adjustment means comprises a digital data processor in communication with and responsive to said window comparator means.

8. The system of claim 1 wherein said measuring means comprises an operational amplifier, said operational amplifier responsive to the value of ground reference high voltage signal $V_{ref}$.

* * * * *